US010692682B1

(12) United States Patent
Moeller et al.

(10) Patent No.: US 10,692,682 B1
(45) Date of Patent: Jun. 23, 2020

(54) HIGH-VOLTAGE GENERATOR FOR PROVIDING A HIGH-VOLTAGE PULSE

(71) Applicant: Siemens Healthcare GmbH, Erlangen (DE)

(72) Inventors: Marvin Moeller, Jena (DE); Sven Mueller, Urbich (DE); Martin Koschmieder, Uhlstaedt-Kirchhasel (DE); Stefan Willing, Rudolstadt (DE); Oliver Heuermann, Adelsdorf (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 16/704,026

(22) Filed: Dec. 5, 2019

(30) Foreign Application Priority Data

Dec. 12, 2018 (DE) .......................... 10 2018 221 518

(51) Int. Cl.
*H01J 25/50* (2006.01)
*H03K 3/53* (2006.01)
*H01J 23/34* (2006.01)

(52) U.S. Cl.
CPC .............. *H01J 25/50* (2013.01); *H01J 23/34* (2013.01); *H03K 3/53* (2013.01)

(58) Field of Classification Search
CPC ............. H01J 25/50; H01J 23/37; H03K 3/53
See application file for complete search history.

(56) References Cited

U.S. PATENT DOCUMENTS 5,642,275 A * 6/1997 Peng .......................... H02M 7/49
363/137

9,840,159 B2 * 12/2017 Braun ..................... H02M 7/06
2008/0150370 A1 6/2008 Heuermann
(Continued)

FOREIGN PATENT DOCUMENTS

DE 102006060417 B4 9/2008
WO WO 2018122038 A1 7/2018

OTHER PUBLICATIONS

E2v technologies "MPT5838 Series Direct Switching Solid-State Modulator" A1A-MPT5838 Series Issue 3, pp. 1-2, May 2005, https://www.e2v.com/shared/content/resources/File/documents/modulators/mpt5838_series.pdf.
(Continued)

*Primary Examiner* — Dedei K Hammond
*Assistant Examiner* — Raymond R Chai
(74) *Attorney, Agent, or Firm* — Harness, Dickey & Pierce, P.L.C.

(57) ABSTRACT

A high-voltage generator provides a high-voltage pulse including a plurality of energy storage cells, each including two input and two output terminals and a capacitor. A controllable switching element is connected to the input terminals and plus terminals and minus terminals are electrically connected to one another via a respective diode. The high-voltage generator further includes a series connection comprising the energy storage cells, a pulse transformer, and a charging terminal for charging the capacitors. In an embodiment, the high-voltage generator is developed so that a greater pulse rate can be achieved. In an embodiment, at least a respective one of the energy storage cells includes an electrical resistance, connected in series with the diode connecting the plus terminals of the respective energy storage cell.

19 Claims, 2 Drawing Sheets

(56) References Cited

U.S. PATENT DOCUMENTS

| | | | | |
|---|---|---|---|---|
| 2013/0127251 A1* | 5/2013 | Graovac | ................ | H02M 7/79 307/82 |
| 2013/0249287 A1* | 9/2013 | Feuerstack | ............. | B60L 58/21 307/20 |
| 2016/0211663 A1* | 7/2016 | Rapp | ...................... | B60L 58/19 |
| 2016/0368392 A1* | 12/2016 | Braun | ................ | H02J 2207/20 |
| 2017/0033686 A1* | 2/2017 | Cadilhon | ................ | H03K 3/53 |

OTHER PUBLICATIONS

Rao, Junfeng et al. "An All Solid-state Repetitive High-Voltage Rectangular Pulse Generator Based on Magnetic Switch" IEEE Transactions on Dielectrics and Electrical Insulation, vol. 22, No. 4. pp. 1976-1982, Aug. 11, 2015 // DOI: 10.1109/TDEI.2015.004956.
German Office Action dated Nov. 22, 2019.

* cited by examiner

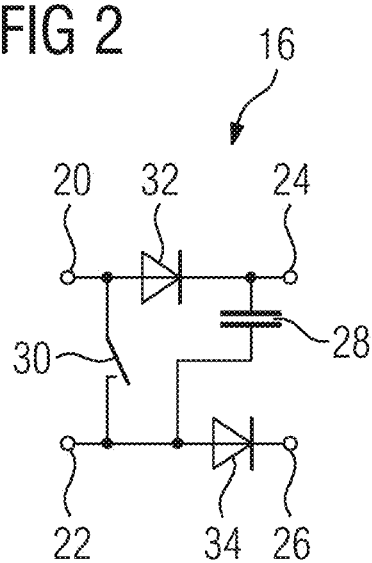
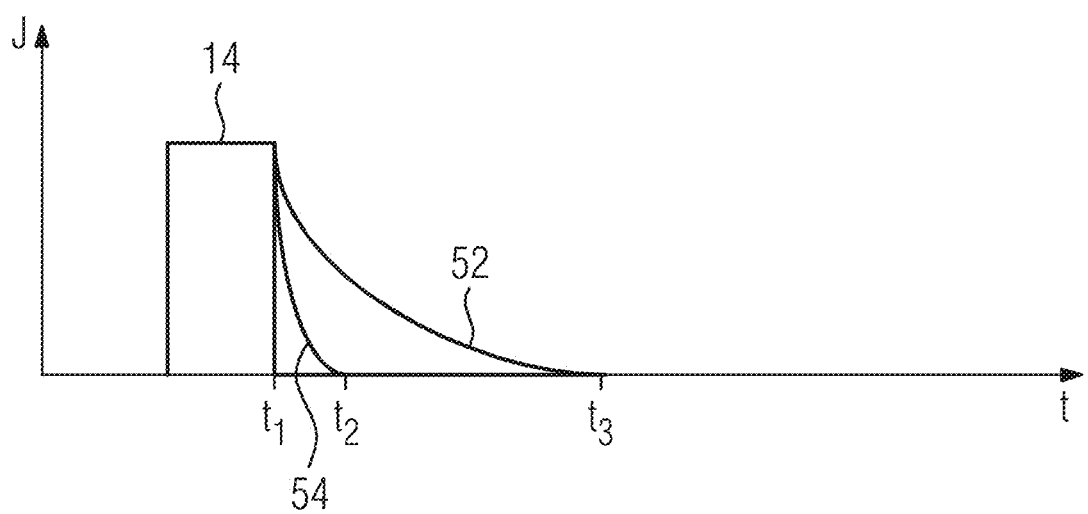

HIGH-VOLTAGE GENERATOR FOR PROVIDING A HIGH-VOLTAGE PULSE

PRIORITY STATEMENT

The present application hereby claims priority under 35 U.S.C. § 119 to German patent application number DE 102018221518.9 filed Dec. 12, 2018, the entire contents of which are hereby incorporated herein by reference.

FIELD

Embodiments of the invention generally relate to a high-voltage generator for providing a high-voltage pulse, having a plurality of energy storage cells, wherein each of the energy storage cells has in each case at least two input and two output terminals as well as a capacitor, which is connected with a first of its terminals to a minus terminal of the two input terminals and with a second of its terminals to a plus terminal of the two output terminals, wherein a controllable switching element is connected to the input terminals and the plus terminals and the minus terminals are in each case connected electrically to one another by way of a diode, by respective anodes of the diodes being connected to the input terminals and respective cathodes of the diodes being connected to the output terminals, a series connection comprising the energy storage cells, in which the respective input terminals of a respective one of the energy storage cells are connected to the respective output terminals of one of the energy storage cells arranged upstream in the series connection, so that as input terminals the series connection provides the input terminals of the first of the energy storage cells and as output terminals the series connection provides the output terminals of the last of the energy storage cells, a pulse transformer with at least one primary winding and at least one secondary winding for providing the high-voltage pulse, wherein the at least one primary winding is connected to the plus terminals of the series connection, and a charging terminal for charging the capacitors with energy from an energy source which can be connected to the charging terminal, wherein a minus terminal of the charging terminal is provided by the minus terminal of the output terminal of the series connection and a plus terminal is provided by one of the plus terminals of the first of the energy storage cells.

Furthermore, embodiments of the invention generally relate to a high-frequency generator with a magnetron and a high-voltage generator which is connected to the magnetron.

BACKGROUND

High-voltage generators of the generic type and also high-frequency generators which have at least one magnetron which are connected to generic high-voltage generators, are known extensively in the prior art in principle, so that there is no need for separate published proof hereof. Generic high-voltage generators are used to generate high-voltage pulses in order thus to be able to operate further electrical facilities, such as a magnetron, for instance. High-voltage generators can be used for instance to operate a magnetron in its intended way, in order to provide a high-frequency generator, with which electromagnetic waves, for instance in the centimeter range or suchlike, can be generated, so that a wide variety of applications can be realized, for instance in the area of safety, during a non-destructive testing of materials and/or suchlike. For this purpose generic high-voltage generators frequently use a Marx topology, in which a predetermined number of capacitors is used as an energy storage unit, wherein the capacitors are charged connected in parallel in a first operating mode and connected in series in a second operating mode provide the electrical energy for the high-voltage pulse. The provided energy is fed to the pulse transformer on a primary winding. The pulse transformer performs a voltage conversion, so that the high-voltage pulse is provided accordingly on a secondary winding of the pulse transformer.

It is currently desirable in many applications to be able to consecutively provide a plurality of high-voltage pulses in as brief a succession as possible. In the meantime it is desirable in the area of safety and also during the non-destructive testing of materials to be able to provide pulse rates of the high-voltage pulses of up to 1 kHz or even more, for instance.

With high-voltage generators of the generic type, it has proven to be problematic however that on account of the pulse transformer after generating a respective individual high-voltage pulse, the energy stored in the pulse transformer and circuit possibly connected to its secondary winding has to be absorbed by way of a freewheel path via the energy storage cells. This has proven to be disadvantageous in that a time constant for the energy absorption is in a period of time which can extend beyond one or more milliseconds. In this way the pulse rate, which can be provided by the high-voltage generator, is very limited so that in particular desired pulse rates of up to one kHz or even more cannot be achieved with known high-voltage generators.

If the respective energy was namely not absorbed completely before generating a subsequent high-voltage pulse, this can result in the stored energy increasing with each pulse. This may lead to unwanted and hazardous states.

SUMMARY

At least one embodiment of the invention is directed to further developing a generic high-voltage generator and a generic high-frequency generator so that a greater pulse rate can be achieved.

At least one embodiment of the invention proposes a high-voltage generator and a high-frequency generator.

Advantageous developments result from the features of the claims.

At least one embodiment of the invention is directed to a high-voltage generator for providing a high-voltage pulse, comprising:

a plurality of energy storage cells, each energy storage cell of the plurality of energy storage cells, including
      two input terminals,
      two output terminals and
      one capacitor, the one capacitor being connected with a first terminal to minus terminals of the two input terminals and being connected with a second terminal to plus terminals of the two output terminals,
      wherein a controllable switching element is connected to the input terminals,
      wherein the plus terminals and the minus terminals are respectively connected electrically via respective diodes, respective anodes of the diodes being connected to the input terminals and respective cathodes of the diodes being connected to the output terminals;
    a series connection, including the plurality of energy storage cells, respective input terminals of a respective one of the plurality of energy storage cells being connected to respective output terminals of one of the plurality of energy storage cells arranged relatively upstream in the series connection, the series connection providing respective input terminals of a relatively first energy storage cell of the plurality of energy storage cells as the input terminals and providing respective output terminals of a relatively last energy storage cell of the plurality of energy storage cells as the output terminals;

a pulse transformer including at least one primary winding and including at least one secondary winding, to provide the high-voltage pulse, the at least one primary winding being connected to the plus terminals of the series connection; and a charging terminal to charge capacitors of the plurality of energy storage cells with energy from an energy source, connectable to the charging terminal, wherein a minus terminal of the charging terminal is provided by the minus terminal of the output terminal of the series connection and a plus terminal of the charging terminal is provided by one of the plus terminals of the relatively first energy storage cell of the plurality of energy storage cells, wherein at least one respective energy storage cell, of the plurality of energy storage cells, includes an electrical resistance, connected in series with the diodes connecting the plus terminals of the at least one respective energy storage cell At least one embodiment of the invention is directed to a high-frequency generator comprising a magnetron and the high-voltage generator of at least one embodiment, connected to the magnetron.

BRIEF DESCRIPTION OF DRAWINGS

Further advantages and features become apparent from the following description of example embodiments on the basis of the appended figures. In the figures the same reference signs denote the same features and functions.

In the figures:

FIG. 2 shows a schematic display of an energy storage cell of the high-voltage generator according to FIG. 1; and FIG. 3 shows a schematic diagram of a high-voltage pulse of the high-voltage generator, with which the magnetron according to FIG. 1 is applied.

DETAILED DESCRIPTION OF THE EXAMPLE EMBODIMENTS

Figure 1:
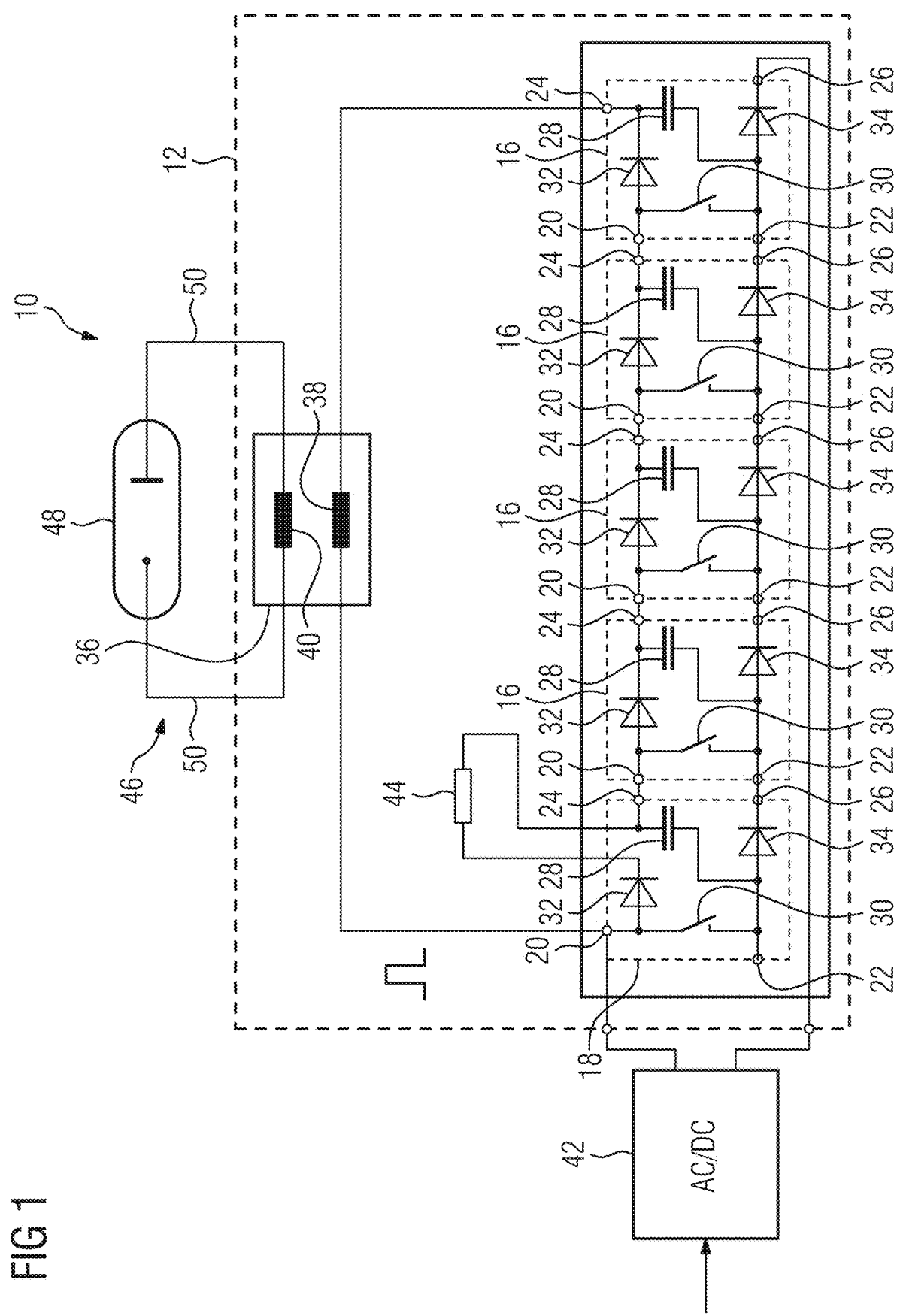
FIG. 1 shows a schematically reduced circuit diagram of a high-frequency generator, which has a magnetron which is connected to a high-voltage generator.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or"

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above.

Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

With respect to a generic high-voltage generator, it is in particular proposed in at least one embodiment that at least one of the energy storage cells has an electrical resistance which is connected in series with the diode connecting the plus terminals of this energy storage cell.

With respect to a generic high-frequency generator, it is proposed in at least one embodiment that its high-voltage generator is embodied according to at least one embodiment of the invention.

At least one embodiment of the invention is based on a principle that it is possible to achieve an increased damping with respect to the energy absorption via the electrical resistance so that the time for the adsorption of energy can be significantly reduced. In this regard it has emerged that the electrical resistance should not be arranged at any position in the series-connected energy storage cells, because the functionality with respect to the provision of the high-voltage pulse and/or also with respect to the charging of the capacitors could then be impaired. In order to avoid this as far as possible, the electrical resistance according to the invention is connected in series with the diode connecting the plus terminals of the first energy storage cell. This means that the impairment of the intended function of the high-voltage generator can largely be kept to a minimum.

At least one embodiment of the invention therefore allows a repetition rate of the high-voltage pulse or a pulse rate to increase significantly so that it is possible in particular to achieve a pulse frequency of 1 kHz or even greater.

At least one embodiment of the invention can moreover be easily realized by only a supplement needing to be performed on one of the energy storage cells. Provision can be made in this way, for instance, for only the first of the energy storage cells of the series connection of an already existing high-voltage generator needing to be replaced with an energy storage cell embodied in accordance with the invention, for instance. Therefore already existing high-voltage generators can be easily retrofitted.

Overall, the time constant for the absorption and thus that of a freewheel current can be significantly reduced by the series connection, because the time constant is at least indirectly proportional to an overall resistance of the corresponding freewheel path through the energy storage cells of the series connection.

One important aspect of at least one embodiment of the invention is therefore to absorb the stored energy downstream of a pulse end of the high-voltage pulse with as small a time constant as possible, via a targeted arrangement of at least one electrical resistance in the freewheel path, wherein at the same time impairing the provision of the high-voltage pulse is essentially to be avoided. This then allows a pulse rate to significantly increase.

In normal operation, high-voltage pulses can be provided via the high-voltage generator, with which a pulse power of for instance approx. 8 kW to approx. 10 Kw can be achieved. Naturally smaller or larger powers can also be realized depending on use. A high-voltage pulse can comprise a pulse voltage with an amplitude in a range of approx. 10 KV to approx. 50 KV, for instance. Depending on the use, the voltage can however also vary and in particular also be greater than 50 KV, for instance.

The high-voltage pulses are provided by way of the secondary winding of the pulse transformer. For this purpose, the primary winding of the pulse transformer is applied accordingly via the energy storage cells connected in series, so that the desired high-voltage pulse can be provided on the secondary side. For this purpose, provision can be made for energy pulses which can comprise an amplitude of for instance approx. 500 Volts up to approx. 2 KV or even more to be provided via series-connected energy storage cells.

Provision can be made here for this voltage to be able to be set by, for instance, only as many of the energy storage cells being activated for the provision of a respective high-voltage pulse as is required for a respective desired high-voltage pulse. Therefore not all energy storage cells in the series connection naturally need to be activated for the provision of a respective high-voltage pulse. Depending on requirements, this can also vary or even be changed during an individual high-voltage pulse. It is therefore possible, for instance, in order to achieve as large a pulse width as possible, to switch on or activate additional energy storage cells during the time frame of the high-voltage pulse with increasing time, in order to stabilize an amplitude of the high-voltage pulse for instance or suchlike. By activating or deactivating individual energy storage cells in the series connection, it is therefore possible to have an effect on the high-voltage pulse with respect to its properties in a desired manner.

The energy storage cells can be embodied as individually manageable components so that it is possible to achieve high flexibility with respect to creating the series connection. By only the input terminals of a respective one of the energy storage cells being electrically connected to the output terminals of an immediately preceding energy storage cell in the series connection, the series connection can therefore be retrofitted almost arbitrarily with respect to the number of energy storage cells. As a result, a modular structure can be achieved which allows the high-voltage generator to be adjusted to a desired application with significant flexibility.

Here the capacitors of the energy storage cells are preferably selected with respect to their voltage strength, capacitance, and current carrying capacity so that the desired high-voltage pulse can be realized with respect to its energy content.

In order to activate a respective one of the energy storage cells in the series connection while providing the high-voltage pulse, the controllable switching element which is switched into a switched-on switching state in order to activate the energy storage cell is provided for each of the energy storage cells. If no high-voltage pulse is provided or the corresponding energy storage cell is deactivated or its capacitor charged, the switching element is in a switched-off switching state.

The two diodes are provided in order to realize the functionality of a respective energy storage cell. Although in the present embodiment diodes are provided, the diodes can if necessary also naturally be replaced by switching elements, in particular semiconductor switching elements, which are operated suitably in a switching operation. In one such case the diodes can therefore be embodied like the controllable switching element, for instance. The switching elements are then to be controlled in a predeterminable manner via a suitable control unit, so that the desired functionality can be provided, which comprises at least the functionality of the diodes.

The pulse transformer is designed in order to be able to transmit energy pulses with a high slew rate. For this purpose, the pulse transformer can have a suitable ferromagnetic core, which can be formed from a suitable ferrite or suchlike for instance. The at least one primary winding and the at least one secondary winding can be wound in a suitable manner onto the core of the pulse transformer, by the windings being arranged one above the other, for instance. Particularly advantageously, the windings can also be wound at least partially bifilar. For this reason, the pulse transformer can however also have two or more primary and/or secondary windings. These can be connected at least partially in parallel.

The high-voltage generator further has the charging terminal for charging the capacitors with energy from an energy source which can be connected to the charging terminal. The charging terminal can be provided to be connected to a direct voltage energy source which provides a predetermined direct voltage. For instance, provision can be made for the energy source to provide a direct voltage in a range of approx. 0 V up to approx. 400 V. The energy source can to this end comprise a power supply unit, which can be connected to a public power supply network as an energy source or suchlike. The public power supply network can provide a three-phase alternating voltage, for instance, which can amount to approx. 400 V, for instance. A frequency of the alternating voltage can lie for instance in a range of approx. 50 Hz to approx. 60 Hz.

A minus terminal of the charging terminal is provided here by the minus terminal of the output terminal of the series connection and a plus terminal of the charging terminal is provided by one of the plus terminals of the first of the energy storage cells. This makes it possible to supply the energy storage cells with electrical energy in parallel from the energy source so that their capacitors are charged. The switching topology of the series connection and the energy storage cells causes the capacitors, for charging in the manner of a parallel connection, to be electrically coupled with the energy source so that they are simultaneously charged by the energy source, namely to a capacitor voltage which essentially corresponds approximately to the direct voltage provided by the energy source. This achieves a rapid charging of the capacitors of the energy storage cells, so that a correspondingly large pulse rate of the high-voltage generator can also be reached.

The energy source can also be formed by an alternating voltage source, however. In this case provision can then be made for the charging terminal to be formed by the plus terminal of the input terminals of the first of the energy storage cells of the series connection and the minus terminal of the output terminals of the series connection. In this case, the diodes can at the same time also realize a rectifier function, so that a charging unit connected to the energy supply network can be reduced or even spared.

The electrical resistance can, depending on requirements and possibly also resistance value, also be realized by a cable guide of the corresponding energy storage cell. The electrical resistance can naturally also be formed by a separate component, which is arranged on the respective energy storage cell.

The electrical resistance is preferably embodied to be able to provide a suitable capability so that the energy to be absorbed can be reliably and safely converted into heat in the provided time. For this purpose, provision can furthermore be made for the electrical resistance to be connected to a suitable cooling unit or heat sink, which allows thermal energy occurring during normal operation to be reliably discharged.

Although the high-frequency generator here has the feature of the at least one magnetron, this term should however not be designed restricted hereto. Instead, this term is to be designed so that a klystron or suchlike can also be provided instead of the magnetron. In this respect, the term "magnetron" in this disclosure should also comprise comparable facilities such as the klystron or suchlike, namely in particular also such facilities which use high voltage in order to output electromagnetic waves, particularly in the high-frequency range.

At least one embodiment of the invention makes it possible overall for the energy to be absorbed to be able to be absorbed with a time constant which is significantly smaller than a millisecond, preferably in the range of a few microseconds. As a result, a high pulse rate can be achieved for the high-voltage pulses via the high-voltage generator of at least one embodiment, so that pulse rates of approx. 1 kHz or even more can also be achieved.

As a result, at least one embodiment of the invention also opens up new application fields so that for instance a container screening can be carried out at great speed, so that for instance a container train can already be reliably screened during propulsion when passing through a corresponding screening system. Furthermore, another series of further applications naturally result, which can firstly only be usefully realized because a high pulse rate can be provided by the high-voltage generator.

It has proven particularly advantageous if only the first of the energy storage cells has the electrical resistance. As a result, at least one embodiment of the invention can be realized very easily so that only the first of the energy storage cells needs to be adjusted accordingly. Especially with respect to a retrofitting of existing high-voltage generators, the invention can also be easily subsequently realized without any great expense. Apart from the electrical resistance no further elements are necessary in principle in order to realize at least one embodiment of the invention. In this case the invention can be realized particularly easily, as a result of which there is in particular the option of easily being able to retrofit the invention in the case of existing high-voltage generators.

It is further proposed that a resistance switching element is connected in parallel with the electrical resistance. This embodiment is suited in particular to the resistance element not only exclusively being arranged in the first of the energy storage cells of the series connection. In principle, the electrical resistance can naturally also be arranged in another or a number of arbitrary energy storage cells. A number of electrical resistances which are arranged in a number of the energy storage cells can naturally also be provided as an electrical resistance. Since the electrical resistances arranged in the other energy storage cells than the first of the energy storage cells can however have an influence on the provision of the high-voltage pulse and/or further functions, in this case it is possible for the parallel-connected resistance switching element to short-circuit the electrical resistance for the provision of the high-voltage pulse and/or the further functions so that its influence on the provision of the high-voltage pulse can essentially be ignored. The electrical resistance namely only needs to be activated for the period of time of absorbing the energy.

The plus terminal of the charging terminal is preferably provided by the plus terminal of the output terminal of the first of the energy storage cells. As a result, the capacitor of the first of the energy storage cells can be directly coupled with the energy source, which in this case should be a direct voltage source. As a result, if the first of the energy storage cells has the electrical resistance, it is also possible for this not to be automatically activated for the process of charging the capacitors. Furthermore, in this way it is also possible for the electrical resistance also not to be automatically activated when the pulse is provided.

If, by contrast, the electrical resistance is arranged in one or more of the energy storage cells, the electrical resistance should be short-circuited by the resistance switching element for the process of charging the capacitors in order not only to be able to carry out the charging process of the capacitors as efficiently as possible but also as quickly as possible. A large pulse rate for the high-voltage pulse can further be improved in this way.

It is also proposed that the electrical resistance has a resistance value which is dependent on an impedance of the pulse transformer and/or a capacitance of a circuit connected to the at least one secondary winding. The resistance value of the electrical resistance is therefore preferably selected depending on which impedance the pulse transformer can provide and/or on which capacitance the circuit connected to the pulse transformer on the secondary side has. It has been shown, for instance, that with a momentary break in current on the secondary side of the pulse transformer, line capacitances in particular of the circuit, but also possibly further capacitances may result in the energy stored here being fed via the pulse transformer from the secondary side to the primary side. This energy can then no longer be fed back into the capacitors. This energy is therefore to be absorbed on the primary side with respect to the pulse transformer. The absorption can be optimized by suitably selecting the resistance value.

It has further proven particularly advantageous if the electrical resistance is embodied to be adjustable with respect to its resistance value. This allows the high-voltage generator to be easily adjusted to different applications. As a result, the flexibility with respect to the use of the high-voltage generator can be further improved.

According to one development, it is proposed that the electrical resistance has a resistance value in a range of approx. 0.5Ω to approx. 15Ω, preferably approx. 5Ω. A resistance value has proven to be particularly suitable in this range for the normal operation of generic high-voltage generators. It is possible to achieve a rapid absorption of the energy by the electrical resistance using the resistance values mentioned above.

Furthermore, it is proposed that the electrical resistance is embodied for an electrical power in a range of approx. 0.2 kW to approx. 10 kW, preferably approx. 1 Kw. Resistances of this type have proven to be favorable in terms of acquisition and can be easily arranged in the high-voltage generator. Furthermore, this power range has proven to be preferable for the use of generic high-voltage generators in order to be able to achieve the desired absorption of energy.

It is also proposed that the electrical resistance is arranged so as to be replaceable. This ensures that the high-voltage generator can be easily adjusted to different operating conditions. Furthermore, there is naturally also the option of easily replacing a faulty electrical resistance with a functional electrical resistance. In particular, the maintenance and reliability can be improved as a result.

Furthermore, it is proposed that the electrical resistance is embodied at least partially as a sheet resistance. This means that the electrical resistance can be applied with electrical voltage and/or electrical current in a highly dynamic manner. In particular, it is possible to prevent the electrical resistance from reaching an unwanted interaction with the pulse transformer and/or further circuit parts of the high-voltage generator. Furthermore, it is possible for the energy absorption of the electrical resistance to be homogenized, so that as uniform a load of the electrical resistance as possible can be achieved.

The advantages and effects specified for the inventive high-voltage generator naturally also apply at the same time to the high-frequency generator equipped with the inventive high-voltage generator.

FIG. 1 shows a schematic, reduced circuit diagram of a high-frequency generator 10, which comprises a magnetron 48, which is connected to a high-voltage generator 12 by way of lines 50. The high-voltage generator 12 is supplied for its part with electrical energy from a charging unit 42, which, for this purpose, is connected for its part to a public power supply network (not shown further) and is supplied with electrical energy hereby. Here the charging unit 42 is embodied to be applied with a three-phase alternating voltage of approx. 400 V via the public energy supply network. The charging unit 42 is further embodied to provide a power of approx. 10 kW. The charging unit 42 provides a direct charging voltage of approx. 400 V. The magnetron 48 and the electrical lines 50 form a circuit 46.

The high-voltage generator 12 provides a high-voltage pulse 14 (FIG. 3), with which the magnetron 48 is applied, whereupon the magnetron 48 outputs a corresponding electromagnetic pulse in the high-frequency range. The function of the magnetron 48 is known extensively in the prior art, so that further explanations hereof are omitted.

In the present embodiment the high-voltage generator 12 provides a high-voltage pulse 14 with a voltage amplitude here of approx. 50 KV. Depending on the use and construction of the magnetron 48, another voltage amplitude can however also be provided here, for instance 20 KV, 40 KV or even also a voltage amplitude which is greater than 50 KV.

In the present embodiment, the magnetron 48 has the property that a current flow through the lines 40 ends abruptly when a voltage of approx. 30 KV is not met. This produces problems with respect to the remaining energy of the high-voltage pulse 14, which is stored at least partially also capacitively in the lines 50. This energy cannot be used again in the high-voltage generator 12 for storage purposes, as explained in more detail below.

FIG. 1 also shows the schematic design of the high-voltage generator 12, which provides the high-voltage pulse 14 for operating the magnetron 48. The high-voltage generator 12 is therefore used to provide a plurality of high-voltage pulses 14 which follow one another in terms of time.

For this purpose, the high-voltage generator 12 has a plurality of energy storage cells 16, 18, of which one individual (16) is shown in a schematic circuit diagram in FIG. 2. Each of the energy storage cells 16, 18 has in each case two input and two output terminals 20, 22, 24, 26 and a capacitor 28. The capacitor 28 is connected with a first of its terminals to a minus terminal 22 of the two input terminals and with a second of its terminals to a plus terminal 24 of the two output terminals of the respective one of the energy storage cells 16, 18. A controllable switching element 30 is connected between the input terminals 20, 22 of a respective one of the energy storage cells 16, 18. The switching element 30 can be formed by a semiconductor switching element, for instance a thyristor, a transistor operated in a switching mode, in particular an insulated gate bipolar transistor (IGBT) but also a field effect transistor, for instance a metal oxide semiconductor field effect transistor (MOSFET) or suchlike.

The plus terminals 20, 24 and correspondingly also the minus terminals 22, 26 are in each case electrically connected to one another by way of a respective diode 32, 34, by respective anodes of the diodes 32, 34 being connected to the input terminals 20, 22 and respective cathodes of the diodes 32, 34 being connected to the output terminals 24, 26.

In the embodiment according to FIG. 1 shown here, the high-voltage generator 12 comprises five energy storage cells 16, 18, which are connected to one another here in the series connection. In the series connection, the respective input terminals 22, 22 of a respective one of the energy storage cells 16, 18 are connected to the respective output terminals 24, 26 of one of the energy storage cells 16, 18 arranged immediately upstream in the series connection so that the series connection provides as input terminals the input terminals 20, 22 of the first of the energy storage cells 18 and as output terminals the output terminals 24, 26 of the last of the energy storage cells 16. In alternative embodiments, the number of energy storage cells 16 can naturally be varied almost arbitrarily in order to adjust the high-voltage generator 12 to a respective application. This is not decisive for the use of the invention, however.

The high-frequency generator 12 further comprises a pulse transformer 36, which here has a primary winding 38 and a secondary winding 40 for providing the high-voltage pulse 14. The circuit 46 is connected to the secondary winding 40. The primary winding 38 and the secondary winding 40 are wound onto a ferromagnetic core, not shown further. Provision is also made here for the primary winding 38 and the secondary winding 40 to be wound bifilar onto the core. The primary winding 38 is further connected to the plus terminals 20, 24 in the series connection.

The high-voltage generator 12 further comprises a charging terminal, not shown, for charging the capacitors 28 with energy from the charging unit 42 which can be connected to the charging terminal. This is only shown schematically in the present embodiment. In this embodiment, the charging unit 42 is not included in the high-voltage generator 12, but can, however, in alternative embodiments, also be included in the high-voltage generator 12. A minus terminal of the charging terminal is provided here by the minus terminal 26 of the output terminal of the series connection and a plus terminal of the charging terminal is provided here by the plus terminal 24 of the output terminal of the first of the energy storage cells 18.

During normal operation the high-voltage generator 12 functions in principle according to the Marx principle as follows:

In a first operating mode, in which the capacitors 28 are charged, the controllable switching elements 30 are in the switched-off switching state. The charging unit 42 provides the charging voltage of approx. 400 V as a direct voltage by way of the plus terminal 24 of the first energy storage cell 18 and the minus terminal 26 of the last of the energy storage cells 16, which provide the charging terminals, as a result of which the capacitors 28 are charged to a corresponding direct voltage. In this way the charge current flow takes place by way of the plus terminal 24 of the first energy storage cell 18 directly to its capacitor 28 and via the diodes 32 to the capacitors 28 of the further of the energy storage cells 16. The current flow finishes across the diodes 34 of the energy storage cells 16, 18.

In a second operating mode, in which the high-voltage pulse 14 is provided by the high-voltage generator 12, a corresponding number of energy storage cells 16, 18 is activated according to the desired voltage amplitude of the high-voltage pulse 14, by its controllable switching elements 30 being switched into the switched-on switching state. As a result, a direct voltage determined by the capacitors 28 connected in series in this way is available on the primary winding 38 and is transformed via the pulse transformer 36 to the desired high voltage so that the corresponding high-voltage pulse 14 is available on the secondary winding 40.

A current converter, not shown in further detail, can be used to capture the current in the lines 50 of the switching circuit 46. If the current drops abruptly, this can be detected and the switching elements 30 of the energy storage cells 16, 18 are switched into the switched-off switching state. In this switching state, the energy remaining in the switching circuit 46 can then be absorbed by way of the primary winding 38 and the diodes 32.

This means:

if an abrupt end to the current flow now occurs in the switching circuit 46, as explained above, it is necessary for the energy still available at this point in time in the switching circuit 46 to be discharged. To this end, the stored energy is fed via the pulse transformer 36 and its primary winding 38 back to the series connection comprising the energy storage cells 16, 18, wherein a current flow is established through the diodes 32 of the energy storage cells 16, 18. The energy storage cells 16, 18 therefore make available a freewheel path.

At this point in time, the controllable switching elements 30 are in the switched-off switching state. On account of the minimal damping in this current circuit or freewheel path, a decay time constant for the absorption of the energy is comparatively large and typically amounts to approx. 1 ms to 2 ms. This fact is explained further on the basis of FIG. 3.

FIG. 3 shows a schematic diagram of an energy-time diagram, which is only used for a high-quality display and is not true to scale. Here the energy is dependent on a squared primary current of the primary winding 38. A horizontal axis is assigned to the time t, whereas a vertical axis is assigned to the energy J. The current flow in the switching circuit 46 ends at a time instant t1. With a graph 52, the absorption behavior here is shown in the afore-described case without an electrical resistance 44. At a time instant t3 the energy is largely absorbed so that a new high-voltage pulse 14 can be provided. The time constant amounts here to approx. 1 ms.

With the afore-cited time constant, it is not possible to be able to provide high-voltage pulses 14 with a repetition rate or pulse rate in a region of 1 kHz or more. If, in this embodiment, the pulse rate were namely to move in the corresponding order of magnitude, energy would accumulate increasingly in the system. This may result in dangerous states and incidentally also cause damage.

In order now to reduce the afore-cited problem and to be able to increase the pulse rate for the high-voltage pulse 14, it is proposed in accordance with the invention that the first of the energy storage cells 18 has an electrical resistance 44 which is connected in series with the diode 32 connecting the plus terminals 20, 24 of this energy storage cell 18. From a purely electrotechnical viewpoint, the sequence of series connection of these two elements is irrelevant here.

The electrical resistance 44, which here has a resistance value of approx. 5Ω and is designed for an electric power of approx. 1 kW, allows the time constant for the energy absorption to be significantly shortened, as apparent from FIG. 3 on the basis of the graph 54. At time instant t2, which is clearly before time instant t3, the energy is already sufficiently absorbed.

Decay times in a region of significantly less than approx. 1 μs can be achieved in this way, for instance approx. 100 ns or suchlike. Conversely a decay time in the region of approx. 1 ms or even 2 ms is realized without the electrical resistance 44. The decay times in the diagram in FIG. 3 correspond to respective differences in the time instants t3–t1 or t2–t1.

By way of the now achievable, very short decay time, the pulse rate for the high-voltage pulses 14 can be significantly increased so that pulse rates in the region of approx. 1 kHz or even more can also be achieved.

Even if the present embodiment of the high-voltage generator 12 provides that generally the plus terminal 24 has a positive electrical potential during normal operation compared with the plus terminal 20, the high-voltage generator 12 and its series connection and the energy storage cells can also be designed so that a corresponding negative potential is present. A corresponding dual circuit arrangement can be easily realized accordingly by the person skilled in the art. The use of the invention remains unaffected hereby, however.

Furthermore, the electric resistance 44 can naturally also be provided in other of the energy storage cells 16. It can also be provided in several of the energy storage cells 16. In one such case, it is desirable however for the electrical resistance 44 then to be short-circuited via a resistance switching element so that no unnecessary losses occur in the high-voltage pulse generation of the high-voltage pulse 14. Furthermore, it is also useful to short-circuit the electrical resistance in this regard during a charging process for charging the capacitors 28, in order to be able to achieve as rapid a charging of the capacitors 28 as possible.

Embodiments of the invention are naturally not restricted to precisely five energy storage cells being used. The high-voltage generator can naturally comprise an almost arbitrary number of energy storage cells, which are connected in series in the said manner. The number of energy storage cells can in particular be selected as a function of a value of the voltage of the charging unit and/or an amplitude of the high-voltage pulse to be provided.

Overall the example embodiments are only used to explain the invention and should not be restricted.

Although the present invention has been disclosed in the form of preferred embodiments and variations thereon, it will be understood that numerous additional modifications and variations could be made thereto without departing from the scope of the invention. For the sake of clarity, it is to be understood that the use of "a" or "an" throughout this application does not exclude a plurality, and "comprising" does not exclude other steps or elements. The mention of a "unit" or a "device" does not preclude the use of more than one unit or device.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A high-voltage generator for providing a high-voltage pulse, the high-voltage generator comprising:
    a plurality of energy storage cells, each energy storage cell of the plurality of energy storage cells, including
        two input terminals,
        two output terminals and
        one capacitor, the one capacitor being connected with a first terminal to minus terminals of the two input terminals and being connected with a second terminal to plus terminals of the two output terminals,
        wherein a controllable switching element is connected to the input terminals,
        wherein the plus terminals and the minus terminals are respectively connected electrically via respective diodes, respective anodes of the diodes being connected to the input terminals and respective cathodes of the diodes being connected to the output terminals;
    a series connection, including the plurality of energy storage cells, respective input terminals of a respective one of the plurality of energy storage cells being connected to respective output terminals of one of the plurality of energy storage cells arranged relatively upstream in the series connection, the series connection providing respective input terminals of a relatively first energy storage cell of the plurality of energy storage cells as the input terminals and providing respective output terminals of a relatively last energy storage cell of the plurality of energy storage cells as the output terminals;
    a pulse transformer including at least one primary winding and including at least one secondary winding, to provide the high-voltage pulse, the at least one primary winding being connected to the plus terminals of the series connection; and
    a charging terminal to charge capacitors of the plurality of energy storage cells with energy from an energy source, connectable to the charging terminal, wherein a minus terminal of the charging terminal is provided by the minus terminal of the output terminal of the series connection and a plus terminal of the charging terminal is provided by one of the plus terminals of the relatively first energy storage cell of the plurality of energy storage cells,
    wherein at least one respective energy storage cell, of the plurality of energy storage cells, includes an electrical resistance, connected in series with the diodes connecting the plus terminals of the at least one respective energy storage cell.

2. The high-voltage generator of claim 1, wherein only the relatively first energy storage cell of the plurality of energy storage cells includes the electrical resistance.

3. The high-voltage generator of claim 1, wherein a resistance switching element is connected in parallel with the electrical resistance.

4. The high-voltage generator of claim 1, wherein the plus terminal of the charging terminal is first provided to the plurality of energy storage cells by the plus terminal of the output terminal.

5. The high-voltage generator of claim 1, wherein the electrical resistance includes a resistance value dependent on at least one of an impedance of the pulse transformer and a capacitance of a circuit connected to the at least one secondary winding.

6. The high-voltage generator of claim 1, wherein the electrical resistance is embodied to be adjustable with respect to a resistance value of the electrical resistance.

7. The high-voltage generator of claim 1, wherein the electrical resistance includes a resistance value in a range of approx. $0.5\Omega$ to approx. $15\ \Omega$.

8. The high-voltage generator of claim 1, wherein the electrical resistance is embodied for an electric power in a range of approx. 0.2 kW to approx. 10 kW.

9. The high-voltage generator of claim 1, wherein the electrical resistance is arranged so as to be exchangeable.

10. The high-voltage generator of claim 1, wherein the electrical resistance is embodied at least partially as a sheet resistor.

11. A high-frequency generator, comprising:
a magnetron; and
the high-voltage generator of claim 1, connected to the magnetron.

12. The high-voltage generator of claim 2, wherein a resistance switching element is connected in parallel with the electrical resistance.

13. The high-voltage generator of claim 2, wherein the plus terminal of the charging terminal is first provided to the plurality of energy storage cells by the plus terminal of the output terminal.

14. The high-voltage generator of claim 2, wherein the electrical resistance includes a resistance value dependent on at least one of an impedance of the pulse transformer and a capacitance of a circuit connected to the at least one secondary winding.

15. The high-voltage generator of claim 2, wherein the electrical resistance is embodied to be adjustable with respect to a resistance value of the electrical resistance.

16. The high-voltage generator of claim 7, wherein the electrical resistance includes a resistance value of 5 Ω.

17. The high-voltage generator of claim 8, wherein the electrical resistance is embodied for an electric power of 1 kW.

18. The high-voltage generator of claim 2, wherein the electrical resistance is arranged so as to be exchangeable.

19. The high-voltage generator of claim 2, wherein the electrical resistance is embodied at least partially as a sheet resistor.

* * * * *